United States Patent [19]

Esgar et al.

[11] Patent Number: 4,980,581
[45] Date of Patent: Dec. 25, 1990

[54] DIFFERENTIAL ECL BUS TRI-STATE DETECTION RECEIVER

[75] Inventors: Dwight D. Esgar, Tempe; Ray D. Sundstrom, Chandler, both of Ariz.

[73] Assignee: Motorola, Inc., Schaumburg, Ill.

[21] Appl. No.: 526,267

[22] Filed: May 21, 1990

[51] Int. Cl.$^5$ .......................................... H03K 19/086
[52] U.S. Cl. .................................. 307/473; 307/455; 307/355
[58] Field of Search ........................ 307/473, 455, 355

[56] References Cited

U.S. PATENT DOCUMENTS

| | | | |
|---|---|---|---|
| 4,424,457 | 1/1984 | Leuthold | 307/355 |
| 4,546,272 | 10/1985 | Suzuki et al. | 307/455 |
| 4,587,444 | 5/1986 | Emori et al. | 307/355 |

Primary Examiner—Stanley D. Miller
Assistant Examiner—Scott A. Ouellette
Attorney, Agent, or Firm—Michael D. Bingham

[57] ABSTRACT

A circuit having first and second inputs and first and second outputs includes a differential receiver circuit responsive to the first and second inputs for providing corresponding output logic signals at the first and second outputs. A tri-state detection circuit responsive to the first and second inputs and having an output for providing a first predetermined voltage to the differential receiver circuit when the first and second inputs are in a normal mode and for providing an increased second predetermined voltage to the differential receiver circuit when the first and second inputs are in a tri-state mode wherein oscillation of the differential receiver circuit is prevented and the outputs are forced to known logic states while the noise margin of the differential receiver is increased without a sacrifice in common mode range.

10 Claims, 2 Drawing Sheets

DIFFERENTIAL ECL BUS TRI-STATE DETECTION RECEIVER

BACKGROUND OF THE INVENTION

This invention relates to line receivers and, more particularly, to differential ECL tri-state detection receivers.

Differential drivers and receivers are utilized in numerous applications. Typically the outputs of a differential driver are coupled to the inputs of a differential receiver via a bus. A typical differential receiver consists of a pair of differentially coupled transistors such that their emitters are tied together and the base of one transistor is coupled to a non-inverting input of the differential receiver, while the base of the other transistor is coupled to the inverting input of the differential receiver. Further, the collector of one transistor is coupled to a voltage potential by a first resistor, while the collector of the other transistor is coupled to a voltage potential by a second resistor. When a differential driver goes into a tri-state mode, both the inverting and non-inverting outputs are typically pulled down to a predetermined level, thereby typically producing a logic low at both the inverting and non-inverting inputs of the differential receiver. However, a logic low occurring at both inputs of the differential receiver typically causes the differential receiver to oscillate and forces the outputs of the differential receiver to unknown logic states.

One attempt that prior art has made to prevent oscillation of a differential receiver when its inputs are in a tri-state mode is to provide an offset voltage, typically with a resistor placed in series with one input of the differential receiver, such that when both inputs of the differential receiver are at a logic low, oscillation will not occur since both differential inputs are not at the same voltage due to the voltage drop across the resistor. However, this attempt provides minimal noise margin and distorts the symmetry of the complementary output signals of the differential receiver.

Another attempt prior art has made to prevent oscillation of a differential receiver when its inputs are in a tri-state mode is to provide a third transistor coupled across one of the differentially coupled transistors of the differential receiver such that the collector and emitter of the third transistor is coupled respectively to the collector and emitter of one of the differentially coupled transistors of the differential receiver. Further, the base of the third transistor is held at a constant predetermined voltage such that when both inputs to the differential receiver go to a logic low (tri-state mode), the third transistor becomes active and forces the outputs of the differential receiver to a known logic state and thereby preventing oscillation. However, this attempt provides a little noise margin since the constant voltage at the base of the third transistor reduces the variation allowed at the inputs of the differential receiver.

Hence, a need exists for a differential receiver circuit which can detect when its inputs are in a tri-state mode and force the outputs thereof to a known logic state thereby preventing oscillation of the differential receiver circuit and can also achieve maximum noise margin without sacrificing the common mode range.

SUMMARY OF THE INVENTION

Accordingly, it is an object of the present invention to provide an improved differential receiver circuit.

Another object of the present invention is to provide a differential receiver circuit for detecting when its inputs are in a tri-state mode and forcing the outputs thereof to a known logic state.

Yet, another object of the present invention is to provide a differential receiver circuit for detecting when both its inputs are at a predetermined voltage level while having maximum noise margin.

Still, another object of the present invention is to provide a differential receiver circuit for detecting when its inputs are in a tri-state mode while not sacrificing common mode range.

In carrying out the above and other objects of the present invention, there is provided a circuit having first and second inputs and first and second outputs comprising a differential receiver circuit responsive to the first and second inputs for providing corresponding output logic signals at the first and second outputs; and a detection circuit responsive to the first and second inputs and having an output for providing a first predetermined voltage to the differential receiver circuit when the first and second inputs are in a normal mode and for providing a second predetermined voltage to the differential receiver circuit when the first and second inputs are in a tri-state mode for forcing the outputs of the differential receiver to known logic levels wherein oscillation of the differential receiver circuit is prevented.

The above and other objects, features and advantages of the present invention will be better understood from the following detailed description taken in conjunction with the accompanying drawings.

DETAILED DESCRIPTION OF THE PREFERRED EMBODIMENT

Figure 1:
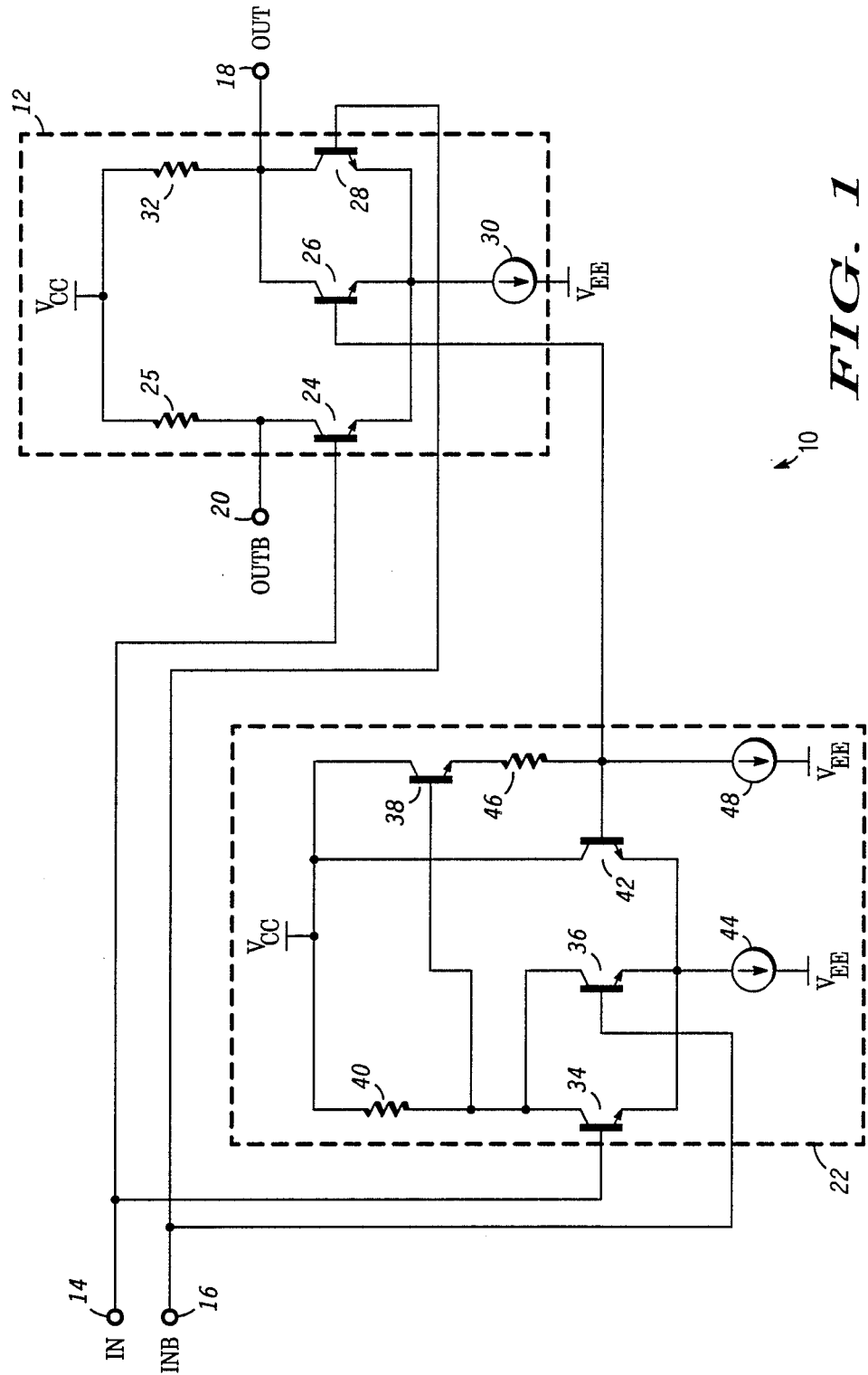
FIG. 1 is a detailed schematic diagram illustrating the preferred embodiment of the present invention.

Referring to FIG. 1, a detailed schematic diagram illustrating preferred embodiment 10 of the present invention is shown comprising differential receiver 12 having first and second inputs coupled to input terminals 14 and 16, respectively, and having first and second outputs coupled to output terminals 18 and 20, respectively. Preferred embodiment 10 further comprises tri-state detection circuit 22 having first and second inputs coupled to input terminals 14 and 16, respectively, and an output coupled to differential receiver 12.

Differential receiver 12 includes transistor 24 having a collector coupled to the second output of differential receiver 12 and to operating potential $V_{CC}$ by resistor 25. The base of transistor 24 is coupled to the first input of differential receiver 12 and the emitter of transistor 24 is coupled to the emitters of transistor 26 and 28 and to operating potential $V_{EE}$ by current source 30. The base of transistor 26 is coupled to the output of tri-state detection circuit 22 while the base of transistor 28 is coupled to the second input of differential receiver 12. The collector of transistor 26 is coupled to the collector of transistor 28, to the first output of differential receiver 12, and to operating potential $V_{CC}$ by resistor 32.

Tri-state detection circuit 22 includes transistor 34 having a collector coupled to the collector of transistor 36, to the base of transistor 38, and to operating potential $V_{CC}$ by resistor 40. The base of transistor 34 is coupled to the first input of tri-state detection circuit 22 while the base of transistor 36 is coupled to the second input of tri-state detection circuit 22. The emitter of transistor 34 is coupled to the emitters of transistors 36 and 42 and to operating potential $V_{EE}$ by current source 44. The collectors of transistors 38 and 42 are both coupled to operating potential $V_{CC}$. The base of transistor 42 is coupled to the emitter of transistor 38 by resistor 46, to the output of tri-state detection circuit 22, and to operating potential $V_{EE}$ by current source 48.

In normal mode operation, a differential signal is typically applied to input terminals 14 and 16 whereby the non-inverting input signal is typically applied at input terminal 14 while the inverting input signal is typically applied at input terminal 16. Furthermore, a differential output signal is provided at output terminals 18 and 20 whereby the non-inverting output signal is typically provided at output terminal 18 while the inverting output signal is typically provided at output terminal 20. It should be understood by one of ordinary skill in the art that reversing the non-inverting and inverting signals at input terminals 14 and 16 will correspondingly reverse the non-inverting and inverting output signals at output terminals 18 and 20, but will not affect the internal operation of differential receiver 12. Transistor 34 will be rendered operative if a logic high is applied to input terminal 14 while transistor 36 will be rendered operative if a logic high is applied to input terminal 16. The important point to realize is that under normal operation, the inputs applied to input terminals 14 and 16 are in a normal mode, that is, one of the inputs is a logic high while the other input is a logic low and either transistor 34 or transistor 36 will be rendered operative while the other is rendered non-operative. This will provide a first predetermined voltage at the output of tri-state detection circuit 22 (the base of transistor 42) which can be calculated as shown below:

$$V_{OUT} = V_{CC} - (R_{40} * I_{44}) - V_{BE(TRAN\ 38)} - (R_{46} * I_{48}) \qquad (1)$$

where $V_{CC}$ is a voltage potential;

$R_{40}$ is the value of the resistance of resistor 40;

$I_{44}$ is the value of the current provided by current source 44;

$V_{BE(TRAN\ 38)}$ is the voltage drop across the base-emitter junction of transistor 38;

$R_{46}$ is the value of the resistance of resistor 46; and $I_{48}$ is the value of the current provided by current source 48.

This first predetermined voltage of tri-state detection circuit 22, as calculated in Eqn. (1), is chosen such that if a logic high is present at the base of transistor 34 or 36, the voltage at the base of transistor 42 will be substantially less than the logic high voltage level occurring at the base of either transistor 34 or 36 and, thus, transistor 42 will be rendered non-operative. Therefore, in normal mode, transistor 42 will be rendered non-operative. Also, this voltage is applied to the base of transistor 26 of differential receiver 12 and, in normal mode, transistor 26 will be rendered non-operative. Further, differential receiver 12 operates such that if the base of transistor 24 is at a logic high and the corresponding base of transistor 28 is at a logic low, then output terminal 18 is a logic high and output terminal 20 is a logic low as is well known in the art. Also, if the base of transistor 24 is at a logic low and the corresponding base of transistor 28 is at a logic high, then output terminal 18 is a logic low and output terminal 20 is a logic high as is also well known in the art. Therefore, in normal mode or in a non tri-state mode, transistor 26 will be rendered non-operative and differential receiver 12 will function as aforedescribed.

On the other hand, in a tri-state mode, both input terminals 14 and 16 are pulled down to a predetermined voltage level such that the base voltages of transistors 34 and 36 are lower than the first predetermined voltage at the base of transistor 42. Therefore, transistor 42 is rendered operative and transistors 34 and 36 are both rendered non-operative thereby raising the base voltage of transistor 38 to operating potential $V_{CC}$, since now there is substantially no current flow through resistor 40. Therefore, a second predetermined voltage is now provided at the output of tri-state detection circuit 22 and calculated as shown below:

$$V_{OUT} = V_{CC} - V_{BE(TRAN\ 38)} - (R_{46} * I_{48}) \qquad (2)$$

where all the terms of Eqn. (2) have been previously defined from Eqn. (1).

This second predetermined output voltage of detection circuit 22, as calculated in Eqn. (2), is applied to the base of transistor 26 thereby raising the voltage thereof. By raising the voltage at the base of transistor 26 to the second predetermined voltage which is chosen to exceed the voltage applied to the bases of transistors 24 and 28 during a tri-state mode, transistor 26 is rendered operative and the first and second outputs of differential receiver 12 are forced to known logic states. In particular, since current is flowing through resistor 32 and transistor 26, the first output of differential receiver 12 is forced to a logic low. Further, since substantially zero current is flowing through transistor 24 and resistor 25, the second output of differential receiver 12 is forced to a logic high. Therefore, since the outputs of differential receiver 12 are forced to known logic states, oscillation of differential receiver 12 is abated.

It is worth noting that since the voltage at the base of transistor 26 can be raised to a wide range of predetermined voltages, the noise margin of differential receiver 12 can be substantially increased. Furthermore, if the voltage at the base of transistor 26 is raised above the midpoint of the logic swings for differential receiver 12, the noise margin of the differential receiver 12 can be made better than the noise margin for single-ended operation, where the noise margin is defined as the maximum extraneous voltage that causes a gate (differential receiver 12) to change its state.

As an example, consider ECL technology where $V_{OUT}$ of Eqn. (1) is typically −1.8 volts and $V_{OUT}$ of Eqn. (2) is typically −1.2 volts. Thus, in normal mode, the voltage at the base of transistor 26 is typically −1.8 volts and differential receiver 12 operates in the normal aforedescribed manner. However, when a tri-state mode occurs, both inputs applied to input terminals 14 and 16 are in cutoff or at −2 volts for ECL technology. This means that transistor 42 becomes active and transistors 34 and 36 become non-active thereby raising the voltage at the base of transistor 26 to about −1.2 volts. This increased base voltage of transistor 26 enables transistor 26 to become active and force the outputs of differential receiver 12 to known output logic states as previously described. Furthermore, this increased base voltage of transistor 26 provides an increased noise margin for differential receiver 12 wherein the voltage variation of the logic levels at the first and second inputs to differential receiver 12 can be substantially increased without changing the logic states of the first and second outputs of differential receiver 12. In addition, if $V_{OUT}$ exceeds $-1.2$ volts during a tri-state mode condition, the noise margin of differential receiver 12 is made better than the noise margin of a single ended ECL receiver.

Figure 2:
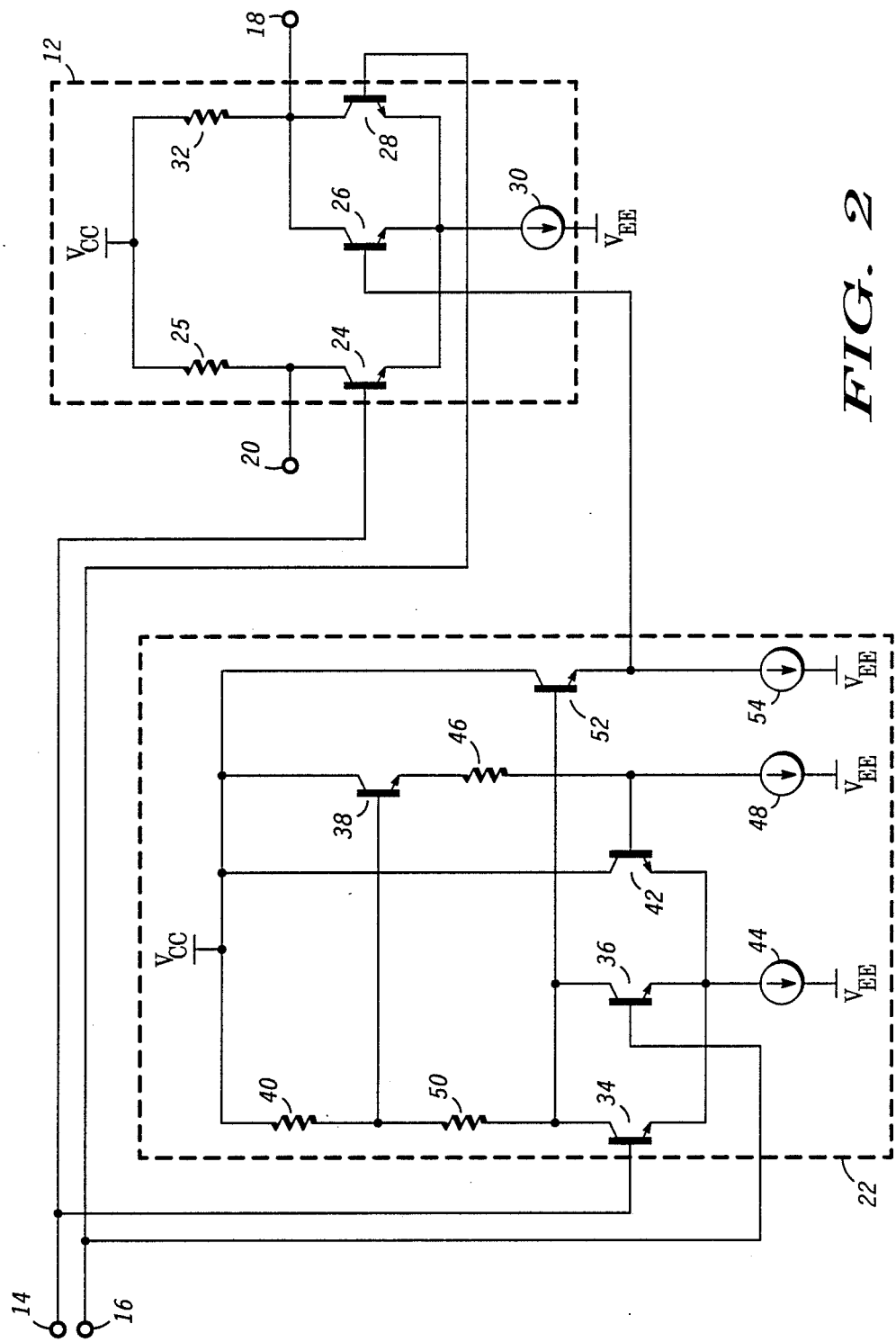
FIG. 2 is a detailed schematic diagram illustrating an alternate embodiment of the present invention.

Referring to FIG. 2, a detailed schematic diagram of an alternate embodiment of the present invention is shown. It is understood that the components similar to those of FIG. 1 are designated by the same reference numerals. The circuit of FIG. 2 further includes resistor 50 coupled between the base of transistor 38 and the collector of transistor 34. Also, transistor 52 has a collector coupled to operating potential $V_{CC}$, a base coupled to the collectors of transistors 34 and 36, and an emitter coupled to operating potential $V_{EE}$ by current source 54 and to the output of tri-state detection circuit 22. It is worth noting that tri-state detection circuit 22 of FIG. 2 has an output coupled to the emitter of transistor 52 as opposed to tri-state detection circuit 22 of FIG. 1 which has an output coupled to the base of transistor 42.

In normal mode operation, a differential signal is supplied to input terminals 14 and 16 whereby the non-inverting signal is typically applied to input terminal 14 and the inverting signal is typically applied to input terminal 16. Furthermore, a differential output signal is provided at output terminals 18 and 20 whereby the non-inverting output signal is typically provided at output terminal 18 while the inverting signal is typically provided at output terminal 20. Transistor 34 will be rendered operative if a logic high is applied to input terminal 14 while transistor 36 will be rendered operative if a logic high is applied to input terminal 36. The important point to realize is that under normal mode operation, the inputs applied to input terminals 14 and 16 are in a normal mode, that is, one of the inputs is a logic high while the other input is a logic low and either transistor 34 or transistor 36 will be rendered operative while the other is rendered non-operative. Similarly as the first predetermined voltage for the circuit in FIG. 1, a third predetermined voltage is provided at the base of transistor 42 which can be calculated as shown below:

$$V_{BASE\ of\ TRAN\ 42} = V_{CC} - (R_{40}*I_{44}) - V_{BE(TRAN\ 38)} - (R_{46}*I_{48}) \quad (3)$$

where $V_{CC}$ is a voltage potential;

$R_{40}$ is the value of the resistance of resistor 40;

$I_{44}$ is the value of the current provided by current source 44;

$V_{BE(TRAN\ 38)}$ is the voltage drop across the base-emitter junction of transistor 38;

$R_{46}$ is the value of the resistance of resistor 46; and $I_{48}$ is the value of the current provided by current source 48.

Likewise to the first predetermined voltage, this third predetermined voltage at the base of transistor 42 is typically chosen such that if a logic high is present at the base of transistor 34 or 36, transistor 42 will be rendered non-operative. Therefore, in normal mode, transistor 42 will be rendered non-operative.

Further, resistor 50 provides an additional voltage drop with respect to operating potential $V_{CC}$ when compared with the single resistor voltage drop of resistor 40 and maintains the voltage at the emitter of transistor 52 and, thus, at the output of tri-state detection circuit 22, at a fourth predetermined voltage which can be calculated as shown below:

$$V_{OUT} = V_{CC} - [(R_{40} + R_{50})*I_{44}] - V_{BE(TRAN\ 52)} \quad (4)$$

where $V_{CC}$ is a voltage potential;

$R_{40}$ is the value of the resistance of resistor 40;

$R_{50}$ is the value of the resistance of resistor 50;

$I_{44}$ is the value of the current provided by current source 44; and $V_{BE(TRAN\ 52)}$ is the voltage drop across the base-emitter junction of transistor 52.

This fourth predetermined voltage is applied to the base of transistor 26 of differential receiver 12 and is typically less than the first predetermined voltage that was applied to the base of transistor 26 for the circuit in FIG. 1. Therefore, the circuit of FIG. 2 provides an increased common mode range over the circuit of FIG. 1 since the voltage levels at input terminals 14 and 16 are allowed an increased variation due to the added voltage occurring across resistor 50 while not forcing differential receiver 12 to switch states. As an example, $V_{BASE\ of\ TRAN\ 42}$ of Eqn. (3) may be $-1.8$ volts while $V_{OUT}$ of Eqn. (4) may be $-2$ volts, which is typical for ECL technology. Thus, one aspect of the circuit in FIG. 2 is that the common mode range has been increased over the circuit in FIG. 1 by maintaining the voltage at the base of transistor 26 at an even lower potential. In addition, for the ECL technology example, the common mode range has been increased by approximately 200 millivolts when the base voltage of transistor 26 is reduced from $-1.8$ volts to $-2$ volts.

Furthermore, for inputs 14 and 16 operating in normal mode, differential receiver 12 operates in a similar aforedescribed manner as differential receiver 12 of the circuit of FIG. 1 such that if the base of transistor 24 is at a logic high and the corresponding base of transistor 28 is at a logic low, then output terminal 18 is a logic high and output terminal 20 is a logic low. Also, if the base of transistor 24 is at a logic low and the corresponding base of transistor 28 is at a logic high, then output terminal 18 is a logic low and output terminal 20 is a logic high. Therefore, in normal mode or a non tri-state mode, transistor 26 will be rendered non-operative and differential receiver 12 will function as described above.

On the other hand, in a tri-state mode, both input terminals 14 and 16 are pulled down to a predetermined voltage level such that the base voltage of transistors 34 and 36 are lower than the base voltage of transistor 42. Therefore, transistor 42 is rendered operative and transistors 34 and 36 are both rendered non-operative thereby raising the base voltages of transistors 38 and 52 to operating potential $V_{CC}$, since now there is substantially no current flow through resistors 40 and 50. As a result, a fifth predetermined voltage is now provided at the output of tri-state detection circuit 22 (emitter of transistor 52) which can be calculated as shown below:

$$V_{OUT} = V_{CC} - V_{BE(TRAN\ 52)} \quad (5)$$

where all the terms of Eqn. (5) have been previously defined from Eqn. (4).

This new fifth predetermined voltage as calculated in Eqn. (5) is applied to the base of transistor 26 thereby raising the voltage thereof. Thus, by raising the voltage at the base of transistor 26 to a predetermined voltage that exceeds the voltage applied to the bases of transistors 24 and 28, transistor 26 is rendered operative and the first and second outputs of differential receiver 12 are forced to known logic states. In particular, the first output of differential receiver 12 is forced to a logic low while the second output of differential receiver 12 is forced to a logic high as was the case for the circuit shown in FIG. 1.

It is important to realize that the voltage at the base of transistor 42 is maintained at a substantially greater voltage than the voltage at the base of transistor 26. This enables tri-state detection circuit 22 to sense the tri-state mode of input terminals 14 and 16 and react to provide an increased voltage at the base of transistor 26 before the bases of transistors 24 and 28 reach the predetermined voltage level as set up by the tri-state mode. Therefore, transistor 26 is rendered operative before the first and second inputs of transistors 24 and 28 reach cutoff wherein oscillation of differential receiver 12 is abated.

For the ECL technology example, as the voltage levels at input terminals 14 and 16 fall below $-1.8$ volts, transistors 34 and 36 are rendered non-operative and transistor 42 is rendered operative. Therefore, the base of transistor 52 is raised to operating potential $V_{CC}$ which correspondingly raises the base voltage of transistor 26 to the fifth predetermined voltage of about $-1.2$ volts before the base voltages of transistors 24 and 28 fall to $-2$ volts. This assures that differential receiver 12 never goes enters oscillation thereby providing a quicker detection of the tri-state mode. It should be noted that the base voltage of transistor 26 can be raised above $-1.2$ volts thereby achieving a common mode range better than that of single-ended operation.

By now it should be apparent from the foregoing discussion that there has been provided a novel differential receiver circuit which can detect a tri-state mode condition and force the outputs thereof to a known logic state thereby preventing differential receiver oscillation and can also achieve maximum noise margin without sacrificing the common mode range.

What is claimed is:

1. A circuit having first and second inputs and first and second outputs, comprising:
    a differential receiver responsive to the first and second input signals applied to first and second inputs for providing corresponding output logic signals at the first and second outputs; and
    detection means responsive to said first and second input signals and having an output for providing a first predetermined voltage to said differential receiver when the first and second input signals are in a normal operating mode and for providing a second predetermined voltage to said differential receiver means when the first and second input signals are in a tri-state mode wherein oscillation of said differential receiver means is prevented as said corresponding output logic signals of said differential receiver are forced to known logic levels.

2. The circuit according to claim 1 wherein said differential receiver includes:
    a first transistor having a collector, base and an emitter, said collector being coupled to a first supply voltage terminal and to the second output, and said base being coupled to the first input;
    a second transistor having a collector, base and an emitter, said collector being coupled to said first supply voltage terminal and to the first output, said base being coupled to the second input, and said emitter being coupled to said emitter of said first transistor;
    a third transistor having a collector, base and an emitter, said collector being coupled to said collector of said second transistor, said base being coupled to said output of said detection means, and said emitter being coupled to said emitter of said second transistor;
    a first resistor coupled between said first supply voltage terminal and said collector of said first transistor;
    a second resistor coupled between said first supply voltage terminal and said collector of said second transistor; and
    a current source coupled between said emitter of said first, second and third transistors and a second supply voltage terminal.

3. The circuit according to claim 1 wherein said detection means includes:
    a first transistor having a collector, base and an emitter, said collector being coupled to a first supply voltage terminal, and said base being coupled to the first input;
    a second transistor having a collector, base and an emitter, said collector being coupled to said collector of said first transistor, said base being coupled to the second input, and said emitter being coupled to said emitter of said first transistor;
    a third transistor having a collector, base and an emitter, said collector being coupled to said first supply voltage terminal, said base being coupled to said output of said detection means, and said emitter being coupled to said emitter of said second transistor;
    a fourth transistor having a collector, base and an emitter, said collector being coupled to said first supply voltage terminal, said base being coupled to said collector of said first transistor, and said emitter being coupled to said base of said third transistor;
    a first resistor coupled between said first supply voltage terminal and said collector of said first transistor;
    a second resistor coupled between said emitter of said fourth transistor and said base of said third transistor;
    a first current source coupled between said emitters of said first, second and third transistors and a second supply voltage terminal; and
    a second current source coupled between said base of said third transistor and said second supply voltage terminal.

4. The circuit according to claim 1 where said detection means includes:
    a first transistor having a collector, base and an emitter, said collector being coupled to a first supply voltage terminal, and said base being coupled to the first input;
    a second transistor having a collector, base and an emitter, said collector being coupled to said collector of the first transistor, said base being coupled to the second input, and said emitter being coupled to said emitter of said first transistor;

a third transistor having a collector, base and an emitter, said collector being coupled to a first supply voltage terminal, and said emitter being coupled to said emitter of said second transistor;

a fourth transistor having a collector, base and an emitter, said collector being coupled to said first supply voltage terminal, said base being coupled to said collector of said first transistor, and said emitter being coupled to said collector of said first transistor, and said emitter being coupled to said base of said third transistor;

a fifth transistor having a collector, base and an emitter, said collector being coupled to said first supply voltage terminal, said base being coupled to said collector of said first transistor, and said emitter being coupled to said output of said detection means;

a first resistor coupled between said first supply voltage terminal and said base of said fourth transistor;

a second resistor coupled between said base of said fourth transistor and said collector of said first transistor;

a third resistor coupled between said emitter of said fourth transistor and said base of said third transistor;

a first current source coupled between said emitters of said first, second and third transistors and a second supply voltage terminal;

a second current source coupled between said base of said third transistor and said second supply voltage terminal; and a third current source coupled between said emitter of said fifth transistor and said second supply voltage terminal.

5. An improved differential receiver circuit for providing corresponding output logic signals at first and second outputs in response to first and second input signals applied at first and second inputs, wherein the improvement comprises:

a tri-state detection circuit responsive to the first and second input signals and having an output for providing a first predetermined voltage to the differential receiver circuit when the first and second input signals are in a normal operating mode and for providing a second predetermined voltage to the differential receiver circuit when the first and second input signals are in a tri-state mode wherein oscillation of the differential receiver circuit is prevented as said corresponding output logic signals of the differential receiver circuit are forced to predetermined external logic levels.

6. The improved differential receiver circuit according to claim 5 wherein the differential receiver circuit includes:

a first transistor having a collector, base and an emitter, said collector being coupled to a first supply voltage terminal and to the second output, and said base being coupled to the first input;

a second transistor having a collector, base and an emitter, said collector being coupled to said first supply voltage terminal and to the first output, said base being coupled to the second input, and said emitter being coupled to said emitter of said first transistor;

a third transistor having a collector, base and an emitter, said collector being coupled to said collector of said second transistor, said base being coupled to said output of said tri-state detection circuit, and said emitter being coupled to said emitter of said second transistor;

a first resistor coupled between said first supply voltage terminal and said collector of said first transistor;

a second resistor coupled between said first supply voltage terminal and said collector of said second transistor; and a current source coupled between said emitter of said first, second and third transistors and a second supply voltage terminal.

7. The differential receiver circuit according to claim 5 wherein said tri-state detection circuit includes:

a first transistor having a collector, base and an emitter, said collector being coupled to a first supply voltage terminal, and said base being coupled to the first input;

a second transistor having a collector, base and an emitter, said collector being coupled to said collector of said first transistor, said base being coupled to the second input, and said emitter being coupled to said emitter of said first transistor;

a third transistor having a collector, base and an emitter, said collector being coupled to said first supply voltage terminal, said base being coupled to said output of said tri-state detection circuit, and said emitter being coupled to said emitter of said second transistor;

a fourth transistor having a collector, base and an emitter, said collector being coupled to said first supply voltage terminal, said base being coupled to said collector of said first transistor, and said emitter being coupled to said base of said third transistor;

a first resistor coupled between said first supply voltage terminal and said collector of said first transistor;

a second resistor coupled between said emitter of said fourth transistor and said base of said third transistor;

a first current source coupled between said emitters of said first, second and third transistors and a second supply voltage terminal; and a second current source coupled between said base of said third transistor and said second supply voltage terminal.

8. The differential receiver circuit according to claim 5 where said tri-state detection circuit includes:

a first transistor having a collector, base and an emitter, said collector being coupled to a first supply voltage terminal, and said base being coupled to the first input;

a second transistor having a collector, base and an emitter, said collector being coupled to said collector of the first transistor, said base being coupled to the second input, and said emitter being coupled to said emitter of said first transistor;

a third transistor having a collector, base and an emitter, said collector being coupled to a first supply voltage terminal, and said being coupled to said emitter of said second transistor;

a fourth transistor having a collector, base and an emitter, said collector being coupled to said first supply voltage terminal, said base being coupled to said collector of said first transistor, and said emitter being coupled to said base of said third transistor;

a fifth transistor having a collector, base and an emitter, said collector being coupled to said first supply voltage terminal, said base being coupled to said collector of said first transistor, and said emitter being coupled to said output of said tri-state detection circuit;

a first resistor coupled between said first supply voltage terminal and said base of said fourth transistor;

a second resistor coupled between said base of said fourth transistor and said collector of said first transistor;

a third resistor coupled between said emitter of said fourth transistor and said base of said third transistor;

a first current source coupled between said emitters of said first, second and third transistors and a second supply voltage terminal;

a second current source coupled between said base of said third transistor and said second supply voltage terminal; and a third current source coupled between said emitter of said fifth transistor and said second supply voltage terminal.

9. A circuit having first and second inputs and first and second outputs, comprising:

a first transistor having a collector, base and an emitter, said collector being coupled to a first supply voltage terminal and to the second output, and said base being coupled to the first input;

a second transistor having a collector, base and an emitter, said collector being coupled to said first supply voltage terminal and to the first output, said base being coupled to the second input, and said emitter being coupled to said emitter of said first transistor;

a third transistor having a collector, base and an emitter, said collector being coupled to said collector of said second transistor, and said emitter being coupled to said emitter of said second transistor;

a fourth transistor having a collector, base and an emitter, said collector being coupled to a second supply voltage terminal, and said base being coupled to the first input;

a fifth transistor having a collector, base and an emitter, said collector being coupled to said collector of said fourth transistor, said base being coupled to the second input, and said emitter being coupled to said emitter of said fourth transistor;

a sixth transistor having a collector, base and an emitter, said collector being coupled to said second supply voltage terminal, said base being coupled to said base of said third transistor, and said emitter being coupled to said emitter of said fifth transistor;

a seventh transistor having a collector, base and an emitter, said collector being coupled to said second supply voltage terminal, said base being coupled to said collector of said fourth transistor, and said emitter being coupled to said base of said sixth transistor;

a first resistor coupled between said first supply voltage terminal and said collector of said first transistor;

a second resistor coupled between said first supply voltage terminal and said collector of said second transistor;

a third resistor coupled between said second supply voltage terminal and said collector of said fourth transistor;

a fourth resistor coupled between said emitter of said seventh transistor and said base of said sixth transistor;

a first current source coupled between said emitters of said first, second and third transistors and a third supply voltage terminal;

a second current source coupled between said emitters of said fourth, fifth and sixth transistors and a fourth supply voltage terminal; and a third current source coupled between said base of said sixth transistor and said fifth supply voltage terminal.

10. A circuit having first and second inputs and first and second outputs, comprising:

a first transistor having a collector, base and an emitter, said collector being coupled to a first supply voltage terminal and to the second output, and said base being coupled to the first input;

a second transistor having a collector, base and an emitter, said collector being coupled to said first supply voltage terminal and to the first output, said base being coupled to the second input, and said emitter being coupled to said emitter of said first transistor;

a third transistor having a collector, base and an emitter, said collector being coupled to said collector of said second transistor, and said emitter being coupled to said emitter of said second transistor;

a fourth transistor having a collector, base and an emitter, said collector being coupled to a second supply voltage terminal, and said base being coupled to the first input;

a fifth transistor having a collector, base and an emitter, said collector being coupled to said collector of said fourth transistor, said base being coupled to the second input, and said emitter being coupled to said emitter of said fourth transistor;

a sixth transistor having a collector, base and an emitter, said collector being coupled to said second supply voltage terminal, and said emitter being coupled to said emitter of said fifth transistor;

a seventh transistor having a collector, base and an emitter, said collector being coupled to said second supply voltage terminal, said base being coupled to said collector of said fourth transistor, and said emitter being coupled to said base of said sixth transistor;

an eighth transistor having a collector, base and an emitter, said collector being coupled to said second supply voltage terminal, said base being coupled to said collectors of said fourth and fifth transistors, and said emitter being coupled to said base of said third transistor;

a first resistor coupled between said first supply voltage terminal and said collector of said first transistor;

a second resistor coupled between said first supply voltage terminal and said collector of said second transistor;

a third resistor coupled between said second supply voltage terminal and said base of said seventh transistor;

a fourth resistor coupled between said base of said seventh transistor and said collector of said fourth transistor;

a fifth resistor coupled between said emitter of said seventh transistor and said base of said sixth transistor;

a first current source coupled between said emitters of said first, second and third transistors and a third supply voltage terminal;

a second current source coupled between said emitters of said fourth, fifth and sixth transistors and a fourth supply voltage terminal;

a third current source coupled between said base of said sixth transistor and said fifth supply voltage terminal; and a fourth current source coupled between said emitter of said eighth transistor and a sixth supply voltage terminal.

* * * * *